(12) United States Patent
Miyamoto et al.

(10) Patent No.: US 7,724,089 B2
(45) Date of Patent: May 25, 2010

(54) AMPLIFYING CIRCUIT

(75) Inventors: Kenichi Miyamoto, Miyazaki (JP);
Hiroaki Ishii, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 12/274,015

(22) Filed: Nov. 19, 2008

(65) Prior Publication Data
US 2009/0140811 A1 Jun. 4, 2009

(30) Foreign Application Priority Data
Nov. 30, 2007 (JP) .............................. 2007-311644

(51) Int. Cl.
*H03F 3/45* (2006.01)
(52) U.S. Cl. ...................... 330/255; 330/311; 330/265; 330/302
(58) Field of Classification Search ................. 330/255, 330/311, 265, 302
See application file for complete search history.

(56) References Cited

U.S. PATENT DOCUMENTS 3,987,369 A * 10/1976 Yokoyama ................... 330/253
4,510,459 A * 4/1985 Guisinger ..................... 330/265
4,668,919 A * 5/1987 de Weck ....................... 330/253
5,361,041 A * 11/1994 Lish .............................. 330/255
7,348,848 B2 * 3/2008 Huang .......................... 330/253
7,528,655 B2 * 5/2009 Golden et al. ................ 330/255

FOREIGN PATENT DOCUMENTS

| JP | 02-303204 | 12/1990 |
| JP | 10-270956 | 10/1998 |
| JP | 3145650 | 1/2001 |
| JP | 2005-341018 | 12/2005 |

* cited by examiner

*Primary Examiner*—Patricia Nguyen
(74) *Attorney, Agent, or Firm*—Studebaker & Brackett PC; Donald R. Studebaker

(57) ABSTRACT

First and second voltage buffers are added to an amplifying circuit including input and output amplifying stages in which a P-MOS transistor and an N-MOS transistor operate as a push-pull circuit. An input of the first voltage buffer is connected to an output of the amplifying circuit, and an output of the first voltage buffer is connected via a first phase compensating capacitor to a gate electrode of the P-MOS transistor, and is connected via a second phase compensating capacitor to a gate electrode of the N-MOS transistor. An input of the second voltage buffer is connected to the output of the amplifying circuit, and an output of the second voltage buffer is connected via a third phase compensating capacitor to the gate electrode of the P-MOS transistor, and is connected via a fourth phase compensating capacitor to the gate electrode of the N-MOS transistor.

16 Claims, 4 Drawing Sheets

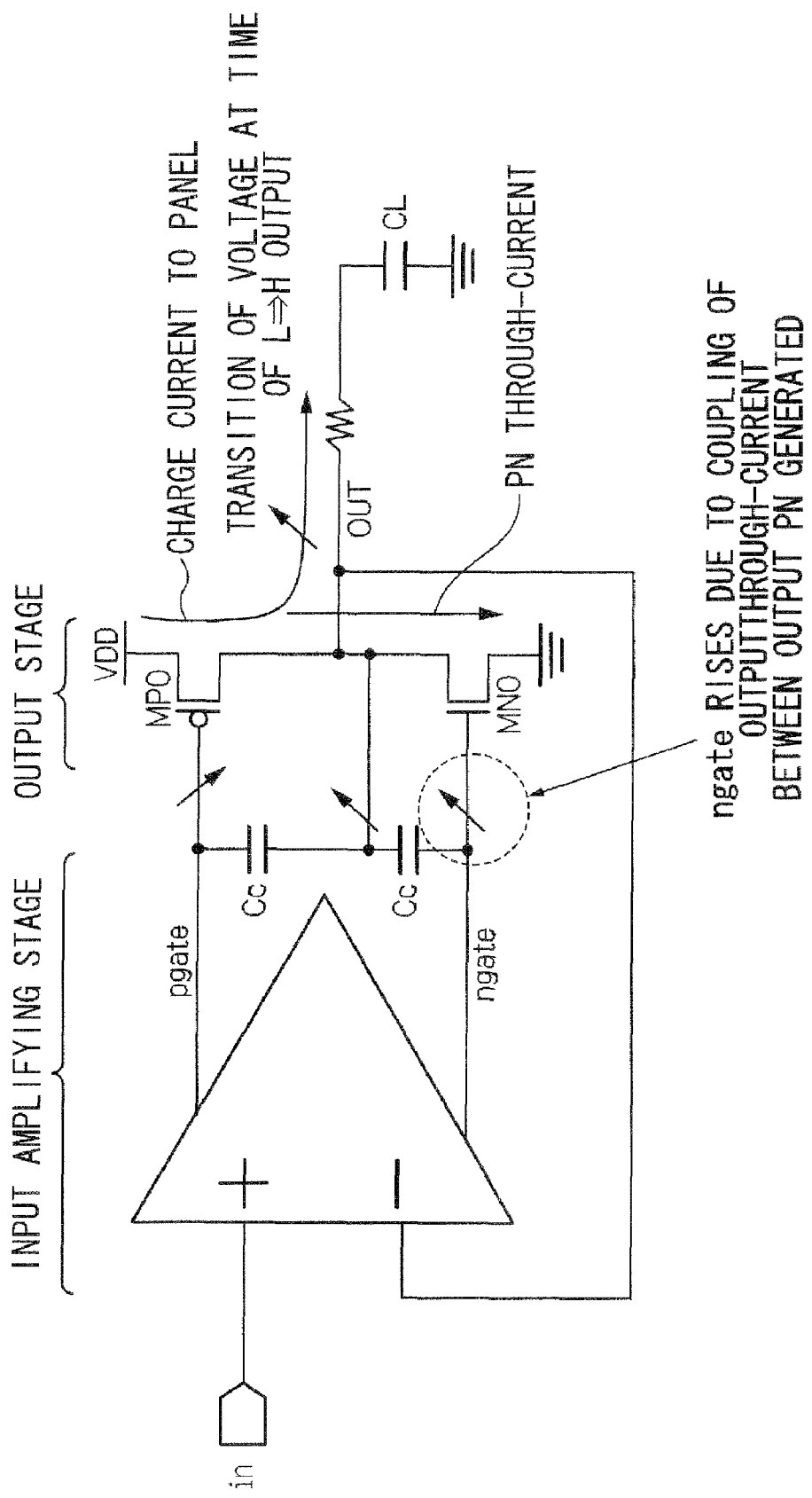

AMPLIFYING CIRCUIT

CROSS-REFERENCE TO RELATED APPLICATION

This application claims priority under 35 USC 119 from Japanese Patent Application No. 2007-311644, the disclosure of which is incorporated by reference herein.

BACKGROUND OF THE INVENTION

1. Field of the Invention

The present invention relates to an amplifying circuit, and in particular, relates to an amplifying circuit that is suited to the driving of a capacitive load.

2. Description of the Related Art

Plural chips, that incorporate therein numerous amplifying circuits for supplying voltage for image writing to the individual cells of a display device, are provided at a driving circuit that drives a display device such as a liquid crystal display (LCD), an organic EL display, or the like. However, as display devices become larger and the levels of the performances required thereof become higher, it is demanded that the amplifying circuits be small-sized and be able to drive the display device, that is a large capacitive load, at a high slew rate and by consuming little electric power. Further, depending on the number of cells (the number of pixels) in the display device that is the object of driving, there are cases in which some of the amplifying circuits within the chips are not connected to the display device and are disposed in a no-load state. Accordingly, it is also required of the amplifying circuits that they not oscillate also in a no-load state. Moreover, the loads connected to the individual amplifying circuits at the time of inspecting and evaluating the chips are lower than at the time of connection to the display device. Accordingly, the amplifying circuits must not oscillate also in the light-load state at the time of inspecting and evaluating the chips, or the like. Suppressing oscillation can be realized by enlarging the capacitors for phase compensation provided at the amplifying circuits. However, this leads to a deterioration in the slew rate and increased size.

In relation thereto, Japanese Patent Application Laid-Open (JP-A) No. 10-270956 (document 1) discloses a phase compensating circuit. This phase compensating circuit has a buffer amplifier that receives the signal of the output stage of an operational amplifier that has an input stage and an output stage. The circuit is structured such that one end of a capacitor for phase compensation is connected to the output of the buffer amplifier, and the other end is connected to the input of the output stage.

Further, JP-A No. 02-303204 (document 2) discloses a structure that is provided with a first phase compensating stage formed from a capacitor CC and transistors M7, M8, and a second phase compensating stage formed from a capacitor CC' and transistors M10 through M13, as phase compensating stages that are connected to a differential input stage and an output amplifying stage.

Moreover, JP-A No. 2005-341018 (document 3) discloses a driving circuit. The driving circuit includes: an operational amplifier that amplifies an input signal and outputs it to a capacitive load; an operating state detecting circuit detecting the operating state of the operational amplifier with respect to the capacitive load; and a variable resistor that is connected to the output of the operational amplifier and that varies the resistance value in accordance with the operating state detected by the operating state detecting circuit.

The technique of document 1 has the advantage that the stability of the operational amplifier with respect to oscillation can be improved by providing a capacitor for phase compensation and a buffer amplifier. However, the output stage is a structure that carries out class A amplification by a single transistor, and the voltage range (effective operating range) over which amplification is carried out on the input signal is narrow. Therefore, this technique is not suited to applications such as driving a display device or the like.

Further, the technique of document 2 can broaden the voltage range in which phase compensating stages function, by providing plural phase compensating stages that are formed from capacitors and transistors. However, in the same way as the technique of document 1, the output stage is a structure that carries out class A amplification by a single transistor, and the effective operating range is narrow. Therefore, this technique is not suited to applications such as driving a display device or the like.

The techniques of documents 1 and 2 can improve stability (make it difficult for the amplifying circuits to oscillate) by making the capacity for phase compensation large. However, generally, the slew rate of an amplifying circuit is proportional to the current of the input amplifying stage (differential stage) of the amplifying circuit (nearly equal to the consumed current of the amplifying circuit) and is inversely proportional to the capacity for phase compensation. Accordingly, if the capacity for phase compensation is made to be large, another problem arises in that the slew rate decreases.

The technique of document 3 requires providing an operating state detecting circuit and a variable resistor. Accordingly, the structure of the amplifying circuit becomes complex and the amount of electric power that is consumed increases. Further, in the technique of document 3, there are cases in which through-current flows through the amplifying circuit. Accordingly, the generation of heat and the like are brought about by this through-current. Through-current will be explained hereinafter.

FIG. 4 illustrates a portion of the driving circuit of document 3, which portion relates to the generating of through-current. In the driving circuit of document 3, a P-type transistor MP0 and an N-type transistor MN0 that operate as a push-pull circuit are provided respectively at the output stage. Further, output end OUT of the output stage is connected to capacitive load CL. Gate pgate of the P-type transistor MP0 and gate ngate of the N-type transistor MN0 are respectively connected to the output end OUT of the output stage via phase compensating capacitors Cc. As shown in FIG. 4 as well, the driving circuit of document 3 basically carries out phase compensation by utilizing the mirror effect.

In this structure, when the input signal voltage to the input amplifying stage rises by a large amplitude from low level to high level, the voltage outputted from the input amplifying stage to the gate pgate decreases, the P-type transistor MP0 turns on, and current that charges the capacitive load CL flows from power supply VDD. At this time, the voltage of the output end OUT increases suddenly. However, because the output end OUT is also connected to the gate ngate via the phase compensating capacitor Cc, the voltage of the gate ngate rises due to the coupling of the phase compensating capacitor Cc (the capacitor works to attempt to make the potential difference of the both ends small), and the N-type transistor MN0 turns on. Due thereto, through-current flows from the power supply through the P-type transistor MP0 and the N-type transistor MN0. The time over which the through-current flows is extremely short. However, several hundred amplifying circuits are provided at the driving circuit of a display device. Accordingly, heat generation that cannot be ignored is brought about due to through-current flowing through the individual amplifying circuits.

SUMMARY OF THE INVENTION

The present invention was made in view of the aforementioned, and provides an amplifying circuit whose effective operating range is broad, and that can realize smaller capacity of capacitors for phase compensation and suppression of through-current.

A first aspect of the present invention is an amplifying circuit including: an amplifying section having an input amplifying stage and an output stage, a first amplifying element and a second amplifying element that are provided at the output stage operating as a push-pull circuit; a first buffer whose input end is connected to an output end of the amplifying section, and whose output end is connected via a first capacitor to a signal input end of the first amplifying element and is connected via a second capacitor to a signal input end of the second amplifying element; and a second buffer whose input end is connected to the output end of the amplifying section or to the output end of the first buffer, and whose output end is connected via a third capacitor to at least the signal input end of the first amplifying element.

In the first aspect of the present invention, the first amplifying element and the second amplifying element are provided at the output stage of the amplifying section that has the input amplifying stage and the output stage. The first amplifying element and the second amplifying element of the output stage operate as a push-pull circuit (the operating voltage ranges of the first amplifying element and the second amplifying element are different). Therefore, a broad effective operating range can be obtained. Note that the output stage of the amplifying section is preferably structured such that the operating voltage ranges of the first amplifying element and the second amplifying element partially overlap, and they operate in A or B. Further, in a second aspect of the present invention, in the above-described aspect, the first amplifying element may be connected respectively to a power supply terminal and the output end of the amplifying section and operated when an output voltage of the amplifying section is to be increased, and the second amplifying element may be connected respectively to a ground terminal and the output end of the amplifying section and operated when an the output voltage of the amplifying section is to be decreased. It is preferable that the input amplifying stage of the amplifying section as well be structured such that so-called rail to rail operation is possible.

The first aspect of the present invention has the first buffer and the second buffer. The input end of the first buffer is connected to the output end of the amplifying section. The output end of the first buffer is connected to the signal input end of the first amplifying element via the first capacitor. Further, the output end of the first buffer is connected to the signal input end of the second amplifying element via the second capacitor. The input end of the second buffer is connected to the output end of the amplifying section or to the output end of the first buffer. The output end of the second buffer is connected at least to the signal input end of the first amplifying element via the third capacitor. In the first aspect of the present invention, the first through third capacitors function as capacitors for phase compensation. However, by providing a buffer between the capacitor for phase compensation and the output end of the amplifying section as described above, the capacitor for phase compensation can be made to be smaller than in a case (the structure of FIG. 4) in which phase compensation is carried out by utilizing the mirror effect as in the technique of document 3.

Namely, in phase compensation utilizing the mirror effect, in a high frequency region, the capacitor Cc for phase compensation functions as a feedback path. Moreover, in this case, the capacitor Cc functions also as a feed-forward path, and therefore, zero arises from a relatively low frequency region. Thus, stable operation of the circuit is adversely affected, and it is easy for oscillation to occur. In contrast, in a case in which a buffer is provided between the capacitor for phase compensation and the output end of the amplifying section, zero can be moved to the high frequency side, and it is easy to ensure the phase margin. As an example, zero ($\omega zm$) in the structure of FIG. 4, and zero ($\omega zb$) in a structure in which the output end of the amplifying section is connected to the input end of the output stage of the amplifying section via a buffer of an amplification factor of Ab and a capacitor for phase compensation, are determined as follows:

$$\omega zm \approx -A_0/Cc \cdot R_0$$

$$\omega zb \approx -A_0 \cdot Ab/Cc \cdot R_0$$

where $A_0$ is the amplification factor of the output end, Ab is the amplification factor of the buffer, Cc is the electrostatic capacity of the capacitor for phase compensation, and $R_0$ is the output resistance of the output stage. As is clear from the above formulas, zero ($\omega zb$) in a structure in which the output end of the amplifying section is connected to the input end of the output stage of the amplifying section via a buffer of an amplification factor of Ab and a capacitor for phase compensation, is Ab times the zero ($\omega zm$) in phase compensation using the mirror effect. Accordingly, it is easier to ensure the phase margin and the capacitors for phase compensation can be made to be smaller, than in phase compensation using the mirror effect.

Accordingly, the capacitors for phase compensation (the total value of the first through third capacitors) in the first aspect of the present invention can be made to be smaller capacity. Further, in the first aspect of the present invention, the output end of the first buffer is connected respectively to the signal input ends of the first amplifying element and the second amplifying element via the first capacitor and the second capacitor. The output end of the second buffer is connected at least to the signal input end of the first amplifying element via the third capacitor. Accordingly, as in a fourth aspect of the present invention that will be described later, by making the operating voltage ranges of the first buffer and the second buffer differ, at least one of the first buffer and the second buffer can be made to operate over the entire region of the wide effective operating range of the amplifying section. Thus, the output voltage dependency of the phase margin can be improved.

Further, in the first aspect of the present invention, because the capacity for phase compensation (the total value of the first through third capacitors) can be made to be small, voltage fluctuations of the signal input ends of the first amplifying element and the second amplifying element due to coupling of the capacity for phase compensation at the time of large amplitude operation can be made to be small. Moreover, by providing a buffer between the output end of the amplifying section and the capacitor for phase compensation, the voltage that is applied to the capacitor for phase compensation via the buffer changes gently with respect to changes in the output voltage of the amplifying section. Accordingly, in the first aspect of the present invention, the first amplifying element and the second amplifying element operate during a time period in which they do not operate originally, and can prevent through-current from flowing. Thus, in accordance with the first aspect of the present invention, there can be provided an amplifying circuit that has a wide effective operating range, and that can realize smaller capacity of capacitors for phase compensation and suppression of through-current.

Moreover, in the first aspect of the present invention, the capacity for phase compensation can be made to be small. Accordingly, the load of the input amplifying stage can be made to be small and the current of the input amplifying stage can be increased, thereby improving the slew rate of the amplifying circuit without leading to an increase in the electric power that is consumed. Moreover, because the capacity for phase compensation can be made to be small, there is no need for the operating state detecting circuit, the variable resistor, or a circuit similar thereto that are in the technique of document 3. Due to the synergistic effects thereof, in the first aspect of the present invention, the size of the amplifying circuit can be reduced, and the electric power that is consumed can be reduced.

In addition, in a third aspect of the present invention, in the above-described aspect, the amplifying section may be configured to operate as a voltage follower. Note that causing the amplifying section to operate as a voltage follower can be realized by connecting the output end of the amplifying section to the input end (more specifically, the inverting input end) of the input amplifying stage of the amplifying section.

In a fourth aspect of the present invention, the above-described aspect may be structured such that the first buffer is a voltage buffer that operates when an output voltage of the amplifying section is within a range that is less than or equal to power supply voltage and greater than or equal to a value that is a first predetermined voltage which is higher than ground voltage, and that outputs a voltage that is lower by the first predetermined voltage than the output voltage of the amplifying section, and the second buffer is a voltage buffer that operates when an output voltage of the amplifying section is within a range that is less than or equal to a value that is a second predetermined voltage which is lower than the power supply voltage and is greater than or equal to the ground voltage, and that outputs a voltage that is higher by the second predetermined voltage than the output voltage of the amplifying section.

Further, in a fifth aspect of the present invention, in the above-described aspect, the first capacitor may be smaller than the second capacitor and the third capacitor. In a structure provided with the first through third capacitors, the first capacitor is a capacitor for supplemental phase compensation, and in the fifth aspect of the present invention, these capacitors can be made to be small. Accordingly, as compared with a case in which the first through third capacitors are all made to be equal, an equal phase margin improving effect is obtained even if the total value of the first through third capacitors is made to be smaller. Further, by making the total value of the first through third capacitors smaller, through-current can be suppressed more reliably, and a further improvement in the slew rate and even smaller size can be realized.

In a sixth aspect of the present invention, in the above-described aspect, the output end of the second buffer may also be connected to the signal input end of the second amplifying element via a fourth capacitor. As described above, in the above-described aspect, the first buffer and the second buffer are provided. Accordingly, the circuit can be structured such that the second buffer is operating when the voltage inputted to the first buffer is outside of the operating voltage range of the first buffer. However, in a case in which the output end of the second buffer is connected only to the signal input end of the first amplifying element via the third capacitor (a case in which the fourth capacitor of the sixth aspect is not provided), feedback to the second amplifying element is not carried out during the time that only the second buffer is operating, and therefore, the phase margin decreases.

In contrast, in the sixth aspect of the present invention, the output end of the second buffer is connected respectively to the signal input ends of the first amplifying element and the second amplifying element via the third capacitor and the fourth capacitor. Accordingly, feedback to the first amplifying element and the second amplifying element is respectively carried out even during the time that only the second buffer is operating. Accordingly, the phase margin during the time that only the second buffer is operating can be improved. Thus, in accordance with the sixth aspect of the present invention, the output voltage dependency of the phase margin can be improved even more.

By providing the fourth capacitor, the second capacitor, that is connected to the signal input end of the second amplifying element in the same way as the fourth capacitor, can be made to be small. Because the capacity for phase compensation (the total value of the first through fourth capacitors) can be made to be even smaller, the load of the input amplifying stage of the amplifying section can be made to be even smaller. Moreover, the abilities of the buffers (the first buffer and the second buffer) to follow the changes in the output voltage also can improve further, and the slew rate of the amplifying circuit can improve further.

In a structure in which the output end of the second buffer is connected only to the signal input end of the first amplifying element via the third capacitor (the structure in which the fourth capacitor of the sixth aspect of the present invention is not provided), as described above, the phase margin in the voltage range where the first buffer does not operate decreases, as compared with the structure of the sixth aspect of the present invention. However, in a case in which it is not absolutely necessary to make the phase margin in this voltage range high (e.g., a case in which it is difficult for oscillation to occur even if the phase margin is low, for some other reason), a structure that is not provided with the fourth capacitor as described above can be employed. Further, even in a structure that is not provided with the fourth capacitor, as compared with the related art, a high phase margin can be ensured in a wide voltage range without making the capacitors for phase compensation large.

In a seventh aspect of the present invention, in the above-described aspect, the first capacitor may be smaller than the third capacitor, and the second capacitor may be larger than the fourth capacitor. In a structure in which the first through fourth capacitors are provided, the first capacitor and the fourth capacitor are supplemental phase compensating capacitors, and these capacitors are made to be small in the invention of the seventh aspect. Accordingly, as compared with a case in which all of the first through fourth capacitors are made to be equal, an equal phase margin improving effect is obtained even if the total value of the first through fourth capacitors is made to be smaller. Further, by making the total value of the first through fourth capacitors even smaller, through-current can be suppressed even more reliably, and a further improvement in the slew rate and an even smaller size can be realized.

As described above, in accordance with the above-described aspects, the amplifying circuit of the present invention has a wide effective operating range and can also suppress through-current.

BRIEF DESCRIPTION OF THE DRAWINGS

Exemplary embodiments of the present invention will be described in detail based on the following figures, wherein:

FIG. 4 is an explanatory drawing for explaining generation of through-current.

DETAILED DESCRIPTION OF THE INVENTION

Examples of exemplary embodiments of the present invention will be described in detail hereinafter with reference to the drawings.

First Exemplary Embodiment

Figure 1:
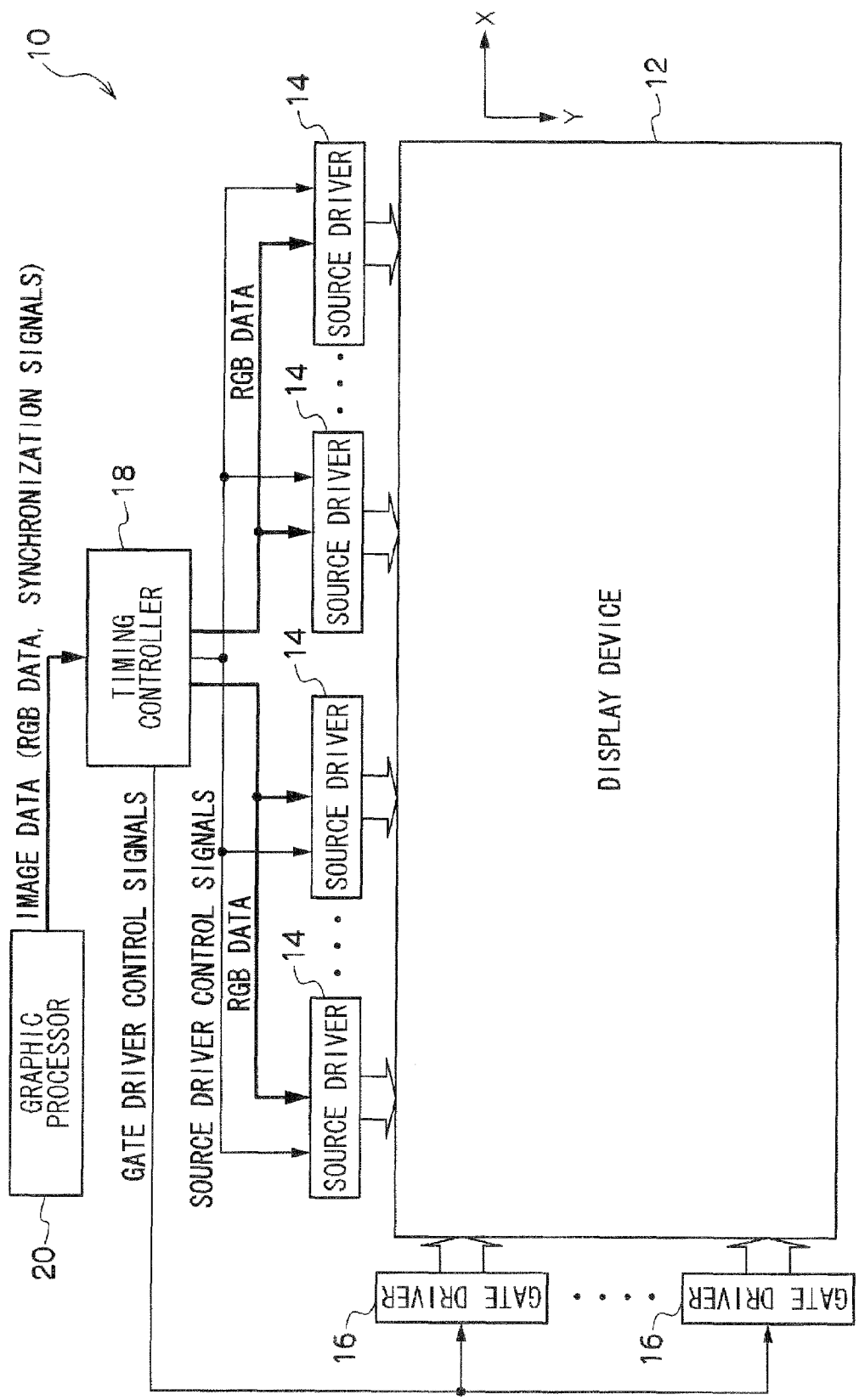
FIG. 1 is a block diagram showing the schematic structure of a display apparatus.

A display apparatus 10 relating to the present exemplary embodiment is shown in FIG. 1. The display apparatus 10 is structured by peripheral circuits being connected to a display device 12 that is formed from a TFT-LCD or the like. Although not shown, in a case in which the display device 12 is a TFT-LCD, the display device 12 includes: liquid crystal sealed between a pair of transparent substrates that are disposed so as to oppose one another with a predetermined interval therebetween; electrodes formed on the entire opposing surface of one of the transparent substrates; numerous data lines disposed on the opposing surface of the other of the transparent substrates so as to be separated at uniform intervals in the X direction, and respectively extending along the Y direction; numerous gate lines disposed at uniform intervals in the Y direction, and respectively extending along the X direction; thin film transistors (TFTs) disposed at the respective intersecting positions of the individual data lines and the individual gate lines (the pixel positions); and electrodes that are respectively provided. Further, at each of the TFTs, the source is connected to the electrode, the gate is connected to the gate line, and the drain is connected to the data line. Note that the display device 12 is not limited to a TFT-LCD, and may be another known display such as, for example, a plasma display, an organic EL display, or the like.

Plural source drivers 14 are added to the display device 12. The data lines of the display device 12 are each connected to a corresponding one of the plural source drivers 14. Plural gate drivers 16 are respectively connected to a timing controller 18. The timing controller 18 is connected to a graphic processor 20. The graphic processor 20 holds, in a frame memory or the like, image data that expresses an image to be displayed on the display device 12. The graphic processor 20 outputs synchronization signals (horizontal synchronization signals and vertical synchronization signals) at uniform periods to the timing controller 18, and, at the respective periods of the horizontal synchronization signals, successively outputs, to the timing controller 18 and from among the held image data, image data of one line of the display device 12 that runs along the X direction (the RGB data expressing the levels of the data voltages to be supplied to the individual data lines of the display device 12).

After writing, in a memory, the RGB data of one line that is inputted from the graphic processor 20, the timing controller 18 reads the RGB data out from the memory and outputs it to the respective source drivers 14. Further, at each of the source drivers 14, after the RGB data of the data line connected to that driver is inputted from the timing controller 18, the source driver 14 supplies, to that corresponding data line, data voltage of the level expressed by the inputted RGB data, for a uniform time period that corresponds to a source driver control signal inputted from the timing controller 18.

Further, the plural gate drivers 16 are added to the display device 12. The gate lines of the display device 12 are each connected to a corresponding one of the plural gate drivers 16. The plural gate drivers 16 are respectively connected to the timing controller 18. In accordance with gate driver control signals that are inputted from the timing controller 18, the gate drivers 16 supply, for a predetermined time period, a gate signal to one gate line among the numerous gate lines of the display device 12. The gate drivers 16 repeat this while switching, in order, the gate line to which the gate signal is supplied. When a gate signal is supplied to a given gate line, all of the one line of TFTs that are connected to that gate line are turned on. The data voltages, that were supplied via the data lines connected to the TFTs that are turned on, are applied to the liquid crystals via the electrodes that are connected to the individual TFTs that are turned on. Then, the light transmittances of the liquid crystals at the respective pixel positions corresponding to the individual TFTs that are turned on change. Due thereto, an image of one line is displayed on the display device 12. By repeating the above-described process, an image is displayed on the display device 12.

Figure 2:
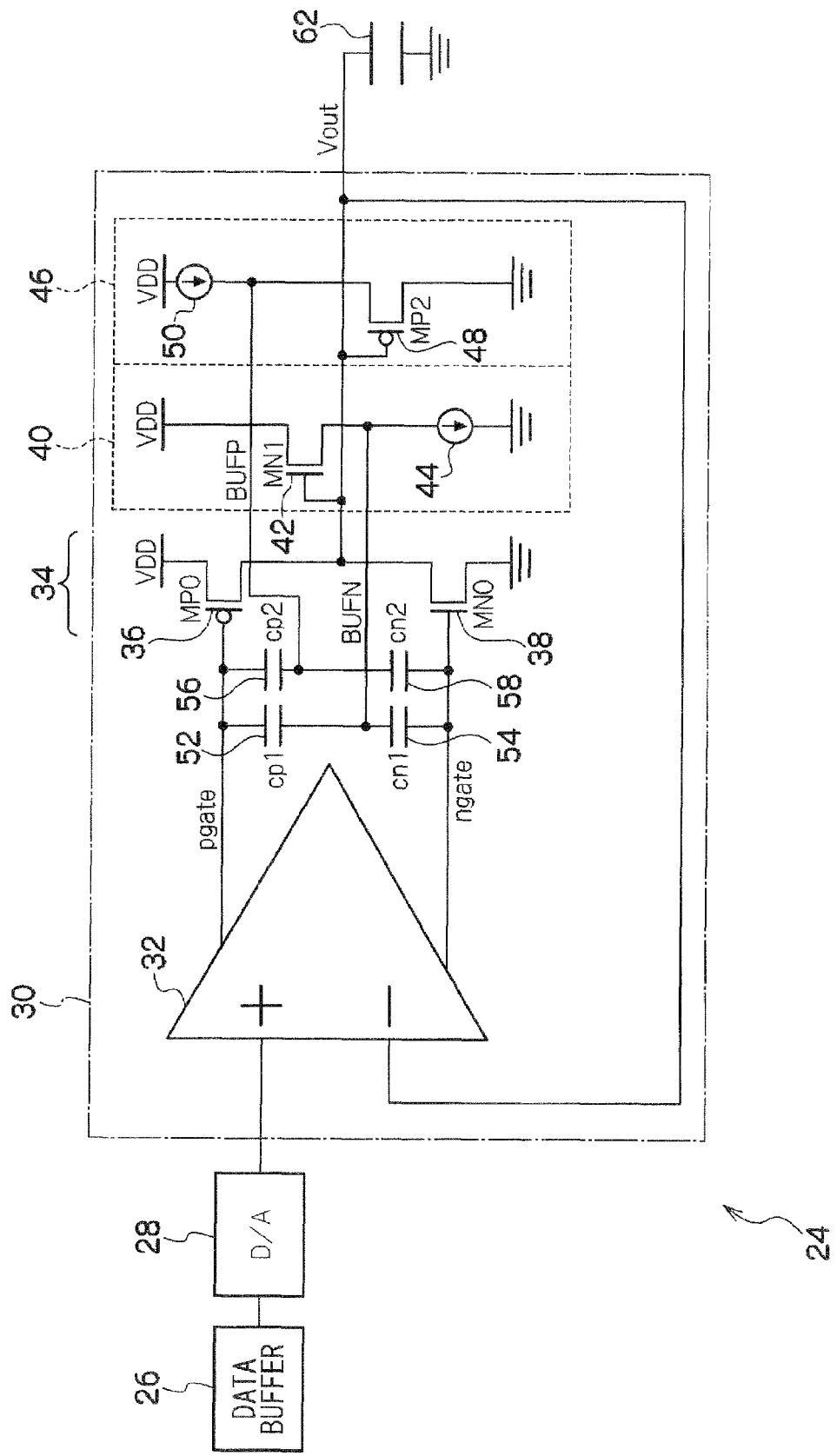
FIG. 2 is a circuit diagram showing an amplifying circuit relating to a first exemplary embodiment.

On the other hand, the individual source drivers 14 are structured such that a driving device 24 shown in FIG. 2 is provided in correspondence with the individual data lines of the display device 12. The driving circuit 24 is structured by a data buffer 26, a D/A (digital/analog) converter 28, and an amplifying circuit 30 being connected in series. The data buffer 26 holds the RGB data that is transferred from the timing controller 18. The D/A converter 28 converts the RGB data outputted from the data buffer 26 into an analog signal of a voltage level corresponding to the value of that RGB data, and outputs the analog signal. The output end of the amplifying circuit 30 is connected to one data line of the display device 12, and the amplifying circuit 30 amplifies the signal inputted from the D/A converter 28 and supplies it to the data line. Note that, in FIG. 2, the pixel (cell) that the amplifying circuit 30 applies data voltage (output voltage Vout of the amplifying circuit 30) to via the data line is illustrated as capacitive load 62.

The amplifying circuit 30 has an input amplifying stage 32 formed from a differential amplifying circuit, and an output stage 34 at which a P-type MOS transistor 36 and an N-type MOS transistor 38 are provided. An amplifying circuit at which so-called rail to rail operation is possible is used as the differential amplifying circuit of the input amplifying stage 32. The non-inverting input end of the input amplifying stage 32 is connected to the output end of the D/A converter 28. Further, the inverting input end is connected to the output end of the amplifying circuit 30. Accordingly, the input amplifying stage 32, together with the output stage 34, operates as a voltage follower. In addition, the input amplifying stage 32 varies the voltage levels of the signals outputted via the output ends, such that the output voltage, that is outputted via the output end of the amplifying circuit 30, follows the voltage changes of the input signal from the D/A converter 28. The output ends of the input amplifying stage 32 are connected to a gate electrode pgate of the P-type MOS transistor 36 and a gate electrode ngate of the N-type MOS transistor 38 of the output stage 34, respectively.

At the P-type MOS transistor 36 of the output stage 34, the source electrode is connected to a power supply terminal and power supply voltage VDD is supplied to the source electrode, and the drain electrode is connected to the output end of the amplifying circuit 30. Further, at the N-type MOS transistor 38, the source electrode is connected to the output end of the amplifying circuit 30, and the drain electrode is connected to a ground terminal. The P-type MOS transistor 36 and the N-type MOS transistor 38 of the output stage 34 operate as a push-pull circuit whose operating voltage ranges with respect to the voltage level of the signal inputted to the gate electrode pgate, ngate differ from one another (in more detail, function as a push-pull circuit that operate in A or B class due to the respective operating voltage ranges thereof partially overlapping). The P-type MOS transistor 36 is operated in a case in which the output voltage is to be increased. The N-type MOS transistor 38 is operated in a case in which the output voltage is to be decreased.

Note that the P-type MOS transistor 36 corresponds to a first amplifying element, and the N-type MOS transistor 38 corresponds to a second amplifying element. The gate electrode of the P-type MOS transistor 36 corresponds to the signal input end of the first amplifying element, and the gate electrode of the N-type MOS transistor 38 corresponds to the signal input end of the second amplifying element.

A first voltage buffer 40 and a second voltage buffer 46 are respectively connected to the output end of the amplifying circuit 30. The first voltage buffer 40 has an N-type MOS transistor 42. The gate electrode of the N-type MOS transistor 42, that serves as the input end of the first voltage buffer 40, is connected to the output end of the amplifying circuit 30. The source electrode of the N-type MOS transistor 42 is connected to a power supply terminal, and the power supply voltage VDD is supplied to the source electrode. The drain electrode of the N-type MOS transistor 42 is grounded via a current source 44. Further, the drain electrode of the N-type MOS transistor 42, that serves as the output end of the first voltage buffer 40, is connected to the gate electrode pgate of the P-type MOS transistor 36 of the output stage 34 via a first phase compensating capacitor 52. The drain electrode of the N-type MOS transistor 42 is also connected to the gate electrode ngate of the N-type MOS transistor 38 of the output stage 34 via a second phase compensating capacitor 54.

The second voltage buffer 46 has a P-type MOS transistor 48. The gate electrode of the P-type MOS transistor 48, that serves as the input end of the second voltage buffer 46, is connected to the output end of the amplifying circuit 30. The source electrode of the P-type MOS transistor 48 is connected to a power supply terminal via a current source 50, and the power supply voltage VDD is supplied to the source electrode via the current source 50. The drain electrode of the P-type MOS transistor 48 is grounded. Further, the source electrode of the P-type MOS transistor 48, that serves as the output end of the second voltage buffer 46, is connected to the gate electrode pgate of the P-type MOS transistor 36 of the output stage 34 via a third phase compensating capacitor 56. The source electrode of the P-type MOS transistor 48 is also connected to the gate electrode ngate of the N-type MOS transistor 38 of the output stage 34 via a fourth phase compensating capacitor 58.

The first phase compensating capacitor 52 corresponds to a first capacitor, the second phase compensating capacitor 54 corresponds to a second capacitor, and the third phase compensating capacitor 56 corresponds to a third capacitor. Further, the fourth phase compensating capacitor 58 corresponds to a fourth capacitor. In the present first exemplary embodiment, the electrostatic capacities of the four phase compensating capacitors, that are the first through fourth phase compensating capacitors, are equal to one another. Further, the source drivers 14 are used in common to drive the display device of an arbitrary number of pixels (number of data lines). Therefore, in a case in which the number of the data lines of the display device that is the object of driving does not coincide with an integer multiple of the number of the driving circuits 24 provided at the source drivers 14, (the amplifying circuits 30 structuring) some of the driving circuits 24 provided at the source drivers 14 are held in a no-load state of not being connected to data lines.

Operation of the amplifying circuit 30 of the present first exemplary embodiment will be described next. The P-type MOS transistor 36 and the N-type MOS transistor 38 of the output stage 34 of the amplifying circuit 30 operate as a push-pull circuit as described above (in more detail, a push-pull circuit that operate in A or B class). Accordingly, a wide effective operating range that is suited to the driving of the display device 12 (the application of data voltages to the capacitive loads 62 corresponding to the individual pixels (cells) of the display device 12) can be obtained.

The first voltage buffer 40 of the amplifying circuit 30 is a level shifting circuit of a source-follower structure of the N-type MOS transistor 42. Accordingly, the voltage buffer 40 operates in a case in which the output voltage Vout of the amplifying circuit 30 is within a range from the power supply voltage VDD to a value that is higher than ground voltage by a threshold voltage Vtn of the N-type MOS transistor 42. Accordingly, output voltage BUFN of the first voltage buffer 40 is a voltage that is lower, by the threshold voltage Vtn, than the output voltage Vout of the amplifying circuit 30. Moreover, the output voltage BUFN, that changes in accordance with the output voltage Vout, is fed-back to the gate electrode pgate of the P-type MOS transistor 36 via the first phase compensating capacitor 52, and is fed-back to the gate electrode ngate of the N-type MOS transistor 38 via the second phase compensating capacitor 54.

The second voltage buffer 46 is a level shifting circuit of a source-follower structure of the P-type MOS transistor 48. Accordingly, the second voltage buffer 46 operates in a case in which the output voltage Vout of the amplifying circuit 30 is within a range from a value, that is lower than the power supply voltage VDD by a threshold voltage Vtp of the P-type MOS transistor 48, to ground voltage. Accordingly, output voltage BUFP of the second voltage buffer 46 is a voltage that is higher, by the threshold voltage Vtp, than the output voltage Vout of the amplifying circuit 30. Moreover, the output voltage BUFP, that changes in accordance with the output voltage Vout, is fed-back to the gate electrode pgate of the P-type MOS transistor 36 via the third phase compensating capacitor 56, and is fed-back to the gate electrode ngate of the N-type MOS transistor 38 via the fourth phase compensating capacitor 58.

In this way, at the amplifying circuit 30 relating to the present first exemplary embodiment, the output voltage Vout of the amplifying circuit 30 is fed-back to the P-type MOS transistor 36 and the N-type MOS transistor 38 of the output stage 34, via the first voltage buffer 40, the first phase compensating capacitor 52 and the second phase compensating capacitor 54. Further, the output voltage Vout is fed-back to the P-type MOS transistor 36 and the N-type MOS transistor 38 of the output stage 34, via the second voltage buffer 46, the third phase compensating capacitor 56 and the fourth phase compensating capacitor 58. Accordingly, as compared with a case of carrying out phase compensation by utilizing the mirror effect (the structure of FIG. 4), zero ($\omega zb$) becomes Ab times (where Ab is the amplification factor of the voltage buffer), and therefore, the capacity for phase compensation for ensuring the phase margin (the total capacity of the first through fourth phase compensating capacitors) can be made to be small.

Because the capacity for phase compensation (the total capacity of the first through fourth phase compensating capacitors) can be made to be small, voltage fluctuations of the gate electrodes of the P-type MOS transistor 36 and the N-type MOS transistor 38 due to coupling of the first through fourth phase compensating capacitors at the time of large amplitude operation can be made to be small. Accordingly, the P-type MOS transistor 36 and the N-type MOS transistor 38 operate in a time period in which they do not operate originally, and through-current can be prevented from flowing. Further, because the capacity for phase compensation can be made to be small, the load of the input amplifying stage 32 can be made to be small. Moreover, because the ability of the first voltage buffer 40 and the second voltage buffer 46 to follow the changes in the output voltage Vout improves, the slew rate of the amplifying circuit 30 can be improved. In addition, decreased size of the chip at which the amplifying circuit 30 is mounted can be realized.

In the present first exemplary embodiment, the operating voltage ranges of the first voltage buffer 40 and the second voltage buffer 46 are different. Namely, the maximum operating voltage at the first voltage buffer 40 coincides with the power supply voltage VDD, and the minimum operating voltage at the second voltage buffer 46 coincides with ground voltage. Therefore, over the entire range of the output voltage Vout of the amplifying circuit 30 (i.e., from the power supply voltage VDD to ground voltage), at least one of the first voltage buffer 40 and the second voltage buffer 46 operates. Accordingly, as compared with a case in which only one voltage buffer is provided, the output voltage dependency of the phase margin also can be improved.

Second Exemplary Embodiment

Figure 3:
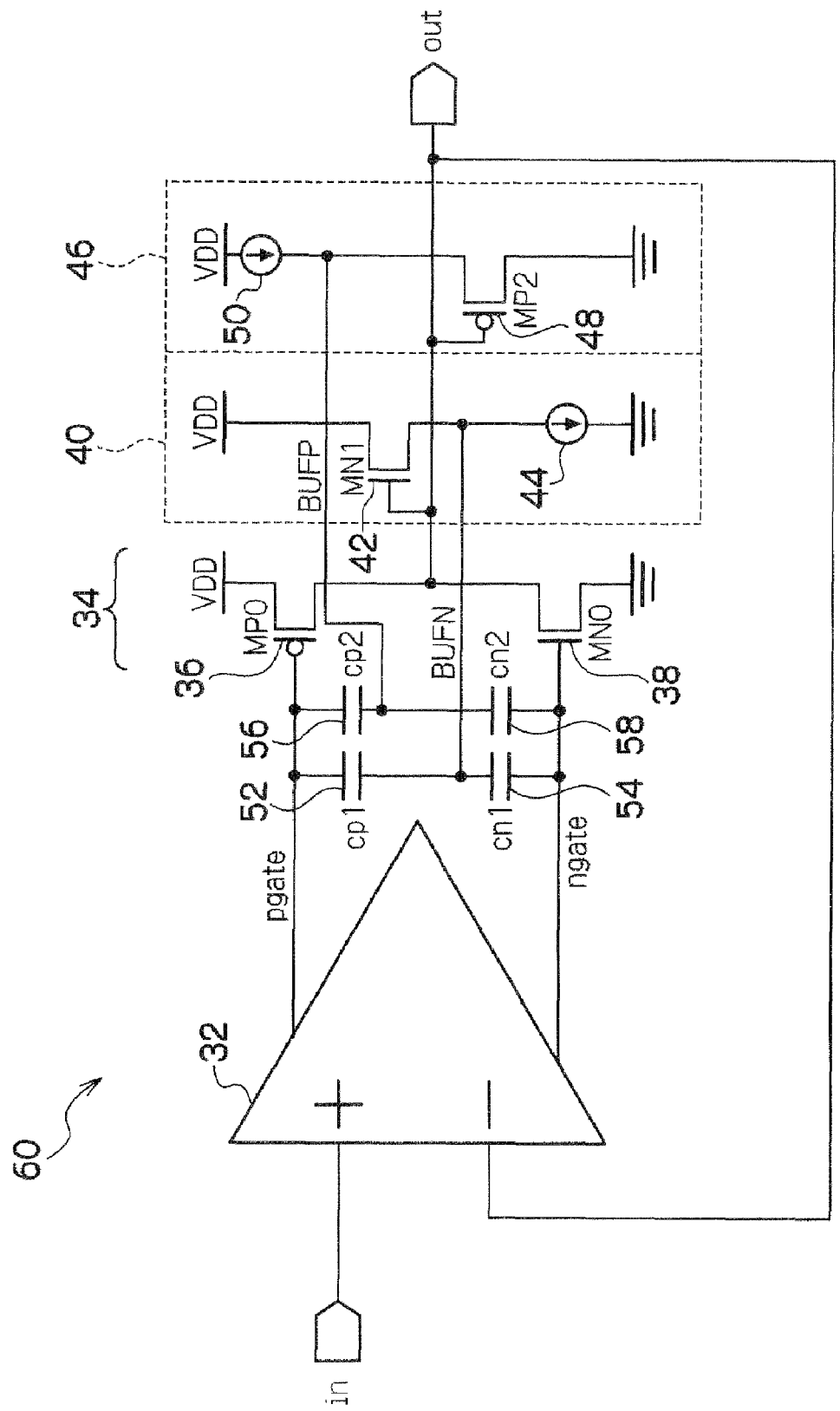
FIG. 3 is a circuit diagram showing an amplifying circuit relating to a second exemplary embodiment.

A second exemplary embodiment of the present invention will be described next. Note that portions that are the same as the first exemplary embodiment are denoted by the same reference numerals, and description thereof is omitted. An amplifying circuit 60 relating to the present second exemplary embodiment is shown in FIG. 3. The amplifying circuit 60 relating to the second exemplary embodiment has substantially the same structure as the amplifying circuit 30 described in the first exemplary embodiment. However, the second exemplary embodiment differs with regard to the point that, given that the electrostatic capacity of the first phase compensating capacitor 52 is Cp1, the electrostatic capacity of the second phase compensating capacitor 54 is Cn1, the electrostatic capacity of the third phase compensating capacitor 56 is Cp2 and the electrostatic capacity of the fourth phase compensating capacitor 58 is Cn2, Cn1 and Cp2 are made to be larger capacity values and Cn2 and Cp1 are made to be smaller capacity values, and the relationships of magnitudes of the electrostatic capacities are Cp2>Cp1, Cn1>Cn2.

Operation of the amplifying circuit 60 relating to the present second exemplary embodiment is the same as that of the amplifying circuit 30 described in the first exemplary embodiment. Accordingly, similarly to the first exemplary embodiment, a wide effective operating range can be obtained and through-current can be suppressed, in the same way as the amplifying circuit 30. Further, as described above, the operating voltage ranges, with respect to the output voltage Vout of the amplifying circuit 60 (30), are different at the first voltage buffer 40 and the second voltage buffer 46 of the amplifying circuit 60 (30). Therefore, when the output voltage Vout is the power supply voltage VDD or a value in the vicinity thereof, only the first voltage buffer 40 operates, whereas if the output voltage Vout is ground voltage or a value in the vicinity thereof, only the second voltage buffer 46 operates. On the basis thereof, Cn1, Cp2 are made to be larger capacity values and Cn2, Cp1 are made to be smaller capacity values in the present second exemplary embodiment.

Due thereto, even in a case in which the capacity value Cp1+Cp2 in the second exemplary embodiment is made to be smaller than the capacity value Cp1+Cp2 in the first exemplary embodiment, a similar phase margin improving effect is obtained. Further, by making the capacity value of Cp1+Cp2 or Cn1+Cn2 small, the load of the input amplifying stage 32 becomes even smaller, and the slew rate of the amplifying circuit 30 can be improved even more. Moreover, an even smaller size of the chip can be realized.

The above describes a structure in which all of the first through fourth phase compensating capacitors are provided. However, the present invention is not limited to the same, and the fourth phase compensating capacitor 58 (or the first phase compensating capacitor 52) may be omitted such that there are three phase compensating capacitors. In a case in which the fourth phase compensating capacitor 58 (or the first phase compensating capacitor 52) is omitted, the phase margin at times when the output voltage Vout of the amplifying circuit is outside of the operating voltage range of the first voltage buffer 40 (or the second voltage buffer 46) falls. However, in cases such as when it is not absolutely necessary for the phase margin at times when the output voltage Vout of the amplifying circuit is outside of the aforementioned operating voltage range to be high, or the like, the number of phase compensating capacitors can be made to be three so that a high phase margin is obtained only in a desired voltage range.

Further, in a case in which the fourth phase compensating capacitor 58 is omitted as described above, it is preferable that the relationships of magnitudes of the electrostatic capacities of the first through third phase compensating capacitors be Cp1<Cn1,Cp2. Moreover, in a case in which the first phase compensating capacitor 52 is omitted, it is preferable that the relationships of magnitudes of the electrostatic capacities of the second phase compensating capacitor 54 through the fourth phase compensating capacitor 58 be Cn2<Cn1,Cp2. In a case in which the electrostatic capacities of the three phase compensating capacitors are made to differ as described above, as compared with a case in which the electrostatic capacities of the three phase compensating capacitors are all made to be equal, an equal phase margin improving effect is obtained even if the total value of the electrostatic capacities of the three phase compensating capacitors is made to be smaller. In addition, by making the total value of the electrostatic capacities of the three phase compensating capacitors smaller, suppression of through-current, an improvement in the slew rate, and decreased size can be realized.

A structure is described above in which the input end of the second voltage buffer 46 is connected to the output end of the amplifying circuit 30 (60). However, the present invention is not limited to this, and the input end of the second voltage buffer 46 may be connected to the output end of the first voltage buffer.

Moreover, the above describes an aspect in which the present invention is applied to an amplifying circuit for driving (supplying data voltage to) a display device such as an LCD or the like. However, provided that it is an amplifying circuit (an operational amplifier) in which the output stage functions as a push-pull circuit, the present invention can of course be applied thereto regardless of the application thereof.

What is claimed is:

1. An amplifying circuit comprising:
   an amplifying section having an input amplifying stage and an output stage, a first amplifying element and a second amplifying element that are provided at the output stage operating as a push-pull circuit;
   a first buffer whose input end is connected to an output end of the amplifying section, and whose output end is connected via a first capacitor to a signal input end of the first amplifying element and is connected via a second capacitor to a signal input end of the second amplifying element; and
   a second buffer whose input end is connected to the output end of the amplifying section or to the output end of the first buffers and whose output end is connected via a third capacitor to at least the signal input end of the first amplifying element.

2. The amplifying circuit of claim 1, wherein the first amplifying element is connected respectively to a power supply terminal and the output end of the amplifying section and is operated when an output voltage of the amplifying section is to be increased, and the second amplifying element is connected respectively to a ground terminal and the output end of the amplifying section and is operated when an the output voltage of the amplifying section is to be decreased.

3. The amplifying circuit of claim 1, wherein the amplifying section is configured to operate as a voltage follower.

4. The amplifying circuit of claim 1, wherein
   the first buffer is a voltage buffer that operates when an output voltage of the amplifying section is within a range that is less than or equal to power supply voltage and greater than or equal to a value that is a first predetermined voltage which is higher than ground voltage, and that outputs a voltage that is lower by the first predetermined voltage than the output voltage of the amplifying section, and
   the second buffer is a voltage buffer that operates when an output voltage of the amplifying section is within a range that is less than or equal to a value that is a second predetermined voltage which is lower than the power supply voltage and is greater than or equal to the ground voltage, and that outputs a voltage that is higher by the second predetermined voltage than the output voltage of the amplifying section.

5. The amplifying circuit of claim 1, wherein the first capacitor is smaller than the second capacitor and the third capacitor.

6. The amplifying circuit of claim 1, wherein the output end of the second buffer is also connected to the signal input end of the second amplifying element via a fourth capacitor.

7. The amplifying circuit of claim 6, wherein the first capacitor is smaller than the third capacitor, and the second capacitor is larger than the fourth capacitor.

8. The amplifying circuit of claim 2, wherein the first capacitor is smaller than the second capacitor and the third capacitor.

9. The amplifying circuit of claim 2, wherein the output end of the second buffer is also connected to the signal input end of the second amplifying element via a fourth capacitor.

10. The amplifying circuit of claim 9, wherein the first capacitor is smaller than the third capacitor, and the second capacitor is larger than the fourth capacitor.

11. The amplifying circuit of claim 3, wherein the first capacitor is smaller than the second capacitor and the third capacitor.

12. The amplifying circuit of claim 3, wherein the output end of the second buffer is also connected to the signal input end of the second amplifying element via a fourth capacitor.

13. The amplifying circuit of claim 12, wherein the first capacitor is smaller than the third capacitor, and the second capacitor is larger than the fourth capacitor.

14. The amplifying circuit of claim 4, wherein the first capacitor is smaller than the second capacitor and the third capacitor.

15. The amplifying circuit of claim 4, wherein the output end of the second buffer is also connected to the signal input end of the second amplifying element via a fourth capacitor.

16. The amplifying circuit of claim 15, wherein the first capacitor is smaller than the third capacitor, and the second capacitor is larger than the fourth capacitor.

* * * * *